PULSE MODULATION CONVERTER

Filed April 18, 1956

INVENTORS
ROBERT L. PLOUFFE, JR.
NELSON WEINTRAUB
BY Alfred C. Hill
AGENT

United States Patent Office 3,004,227

Patented Oct. 10, 1961

3,004,227

PULSE MODULATION CONVERTER

Robert L. Plouffe, Jr., Livingston, and Nelson Weintraub, Irvington, N.J., assignors to International Telephone and Telegraph Corporation, Nutley, N.J., a corporation of Maryland Filed Apr. 18, 1956, Ser. No. 578,963

11 Claims. (Cl. 332—1)

This invention relates to pulse modulation converters and more particularly to a simplified pulse time modulation to pulse width modulation converter.

In the past, conversion from pulse time modulation to pulse width modulation has been accomplished by employing a three-element electronic switch, such as an electron discharge device of the triode type. The circuit components are so arranged in conjunction therewith that the width modulated output is removed from the anode of the triode with a gate pulse input being coupled in parallel to the anode output connection and the control grid of the triode. The triode is normally maintained in a non-conducting condition by a bias voltage on its cathode even in the presence of the gate pulse on the anode. Thus, there will appear at the anode output the leading edge and leading portion of the gate pulse. Time modulated pulses are coupled to the cathode of the triode having a polarity and amplitude sufficient to cause conduction of the triode during the normal duration of the gate pulse. The conduction of the triode will produce the trailing edge of the output pulse having a time of occurrence which will vary in accordance with the position of the time modulated pulse. As is the usual practice, the gate pulse will be timed to recur at the repetition frequency of the time modulated pulses and will have a duration greater than the range of modulation of the time modulated pulse. This prior art behaves as a grounded grid amplifier with respect to the time modulated signal.

It is an object of this invention to provide a simplified circuit for converting time modulated pulses to width modulated pulses.

A feature of this invention is to provide a two-element electronic switch, one element of which is coupled to a source of gate pulses having a duration greater than the modulation range of a time modulated pulse and synchronized with respect to the repetition frequency thereof and the other element of which is coupled to a source of time modulated pulses. A bias means is coupled to said other element to maintain said switch inoperative except upon coincidence of a gate pulse and a time modulated pulse. When this coincidence occurs, said switch is rendered operative to produce the trailing edge of the output pulse, the time of occurrence varying in accordance with the time position of said modulated pulses. An output means is coupled to said one element to obtain the resulting width modulated pulses therefrom.

The two-element electronic switch employed in the circuit of this invention may be a vacuum diode or a semiconductor diode of the germanium or silicon type.

Figure 1:
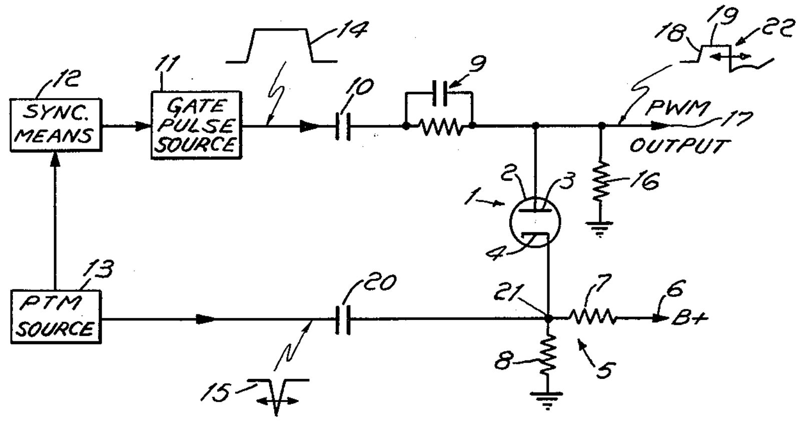
Figure 2:
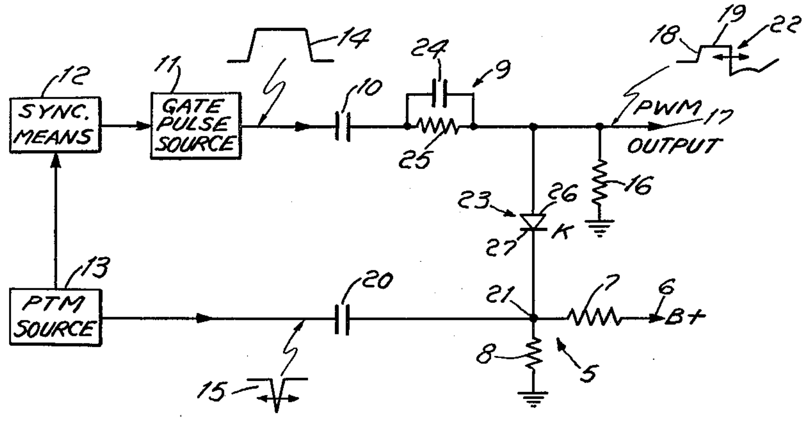

The above-mentioned and other features and objects of this invention will become more apparent by reference to the following description taken in conjunction with the accompanying drawings, in which:

FIG. 1 is a schematic diagram of an embodiment of this invention employing a vacuum diode; and FIG. 2 is a schematic diagram of an embodiment of this invention employing a semiconductor diode.

Referring to FIG. 1, there is illustrated a schematic diagram of the pulse converter of this invention comprising a two-element electronic switch 1 illustrated as being a diode 2 having a first element or anode 3 and a second element or cathode 4. A bias means 5 consisting of a voltage source coupled to terminal 6 and a voltage divider including resistors 7 and 8 extending from terminal 6 to ground is coupled to cathode 4 as shown to provide sufficient voltage to maintain diode 2 in a non-conducting condition even in the presence of a gate pulse on anode 3.

Anode 3 is coupled by means of time constant 9 and coupling condenser 10 to a source of gate pulses 11. The source of gate pulses 11 may be the timing generator of a pulse time modulation receiver which is synchronized by the action of the marker pulse present in pulse time modulation pulse trains of pulse time modulation source 13, the pulse time modulation receiver. The marker pulse is detected by synchronizing means 12 to provide a gate pulse 14 synchronized with the repetition frequency of the time modulated pulses emitted from the pulse time modulation source 13. Gate pulse 14 should have a duration greater than the modulation range of pulse 15, said duration being so disposed as to straddle the modulation range of pulse 15.

The gate pulse 14 is applied to anode 3 and the leading portion thereof is coupled to the output resistance 16 unmodified since diode 2 is maintained non-conducting by the bias means 5. There then appears at the output terminal 17 an output pulse having a leading edge 18 coincident with the leading edge of gate pulse 14 and the leading portion of the gate pulse 14 as indicated at 19. The coupling of time modulated pulse 15 through condenser 20 to cathode 4 renders diode 2 conductive by overcoming the bias voltage at point 21 as established by bias means 5. The conduction of diode 2 modifies gate pulse 14 by producing a trailing edge 22 at the output terminal 17 which coincides with the time position of time modulated pulse 15. When the pulse disappears from cathode 4, the diode 2 is again cut off, and the voltage on the anode charges toward the amplitude of gate pulse 14 through a long time constant circuit 9. The charging of circuit 9 is interrupted by the occurrence of the trailing edge of the input gate 14. Thus, through the action of the two-element switch 1, the time modulated pulse 15 is converted to a width modulated pulse at terminal 17 whose trailing edge varies in position in accordance with the modulation present on pulse 15. The width modulated pulse at terminal 17 may then be further acted upon by a low-pass filter (not shown) which will remove the audio components from the width modulated output pulse and thus enable the recovery of the intelligence signal carried by time modulated pulse 15. Thus, the converter hereindescribed may be employed in the demodulator circuit of a pulse time modulation receiving terminal.

FIG. 2 illustrates a second embodiment of our invention wherein the circuit components, the resistors and condensers, are substantially identical with the resistors and condensers of FIG. 1. The difference between the circuit of FIG. 1 and the circuit of FIG. 2 is that FIG. 2 employs as the two-element electronic switch a semiconductor diode 23. As in FIG. 1, gate pulse 14, synchronized with the repetition frequency of time modulated pulse 15, is coupled through coupling condenser 10 and time constant 9, including condenser 24 and resistor 25, to the anode 26 of semiconductor diode 23. The bias means 5 produces at point 21 a bias voltage sufficient to maintain semiconductor diode 23 in a non-conducting condition even in the presence of gate pulse 14 at anode 26. The forward portion of gate pulse 14 is coupled to output terminal 17 as in connection with FIG. 1. The occurrence of time modulated pulse 15 at cathode 27 causes semiconductor diode 23 to conduct and thus produces trailing edge 22 of the output pulse at terminal 17. This trailing edge will again vary in position in accordance with the modulation of pulse 15.

In a successful reduction to practice of the circuit of

FIG. 2, the gate pulse 14 had a peak amplitude of 30 volts and the voltage at point 21 had a value of 32 volts. The amplitude of the time modulated pulse was greater than 2 volts. For this set of conditions, the components of the circuit of FIG. 2 are as follows:

| | | |
|---|---|---|
| Condenser 10 | mf | 0.01 |
| Condenser 24 | mmf | 51 |
| Condenser 20 | mf | 0.01 |
| Resistor 25 | ohms | 100,000 |
| Resistor 8 | do | 47,000 |
| Resistor 7 | do | 320,000 |
| Resistor 16 | do | 470,000 |
| B+ voltage | volts | 250 |

Semiconductor diode 23, a germanium diode.

It is to be remembered that the two-element electronic switch of this invention may be a vacuum diode as illustrated in FIG. 1 or a semiconductor diode as illustrated in FIG. 2. The semiconductor diode may be a germanium type such as a gold bonded germanium diode or silicon type such as a silicon junction diode. It will, of course, be obvious that the circuit elements may be changed in accordance with the principles of this invention to meet conditions of pulse levels and other variable conditions.

While we have described above the principles of our invention in connection with specific apparatus, it is to be clearly understood that this description is made only by way of example and not as a limitation to the scope of our invention as set forth in the objects thereof and in the accompanying claims.

We claim:

1. A pulse time modulation to pulse width modulation converter comprising a source of time modulated pulses, a source of gate pulses having a duration greater than the modulation of said time modulated pulses and synchronized with respect to the repetition frequency thereof, a diode, means coupling the output of said source of gate pulses to one electrode of said diode to apply said gate pulses to said one electrode, bias means coupled to the other electrode of said diode to maintain said diode normally non-conductive even in the presence of said gate pulses, means coupling the output of said source of time modulated pulses to said other electrode to couple said time modulated pulses to said other electrode to render said diode conductive during the occurrence of said modulated pulses in the duration of said gate pulses to vary the occurrence of the trailing edge of said gate pulses in accordance with the time position of said modulated pulses, and output means coupled to said one electrode to remove the resulting width modulated pulses therefrom.

2. A pulse time modulation to pulse width modulation converter comprising a source of time modulated pulses, a source of gate pulses having a duration greater than the modulation of said time modulated pulses and synchronized with respect to the repetition frequency thereof, a diode, a time constant circuit including a resistor and condenser disposed in a parallel relation coupling the output of said source of gate pulses to one electrode of said diode to apply said gate pulses to said one electrode, bias means coupled to the other electrode of said diode to maintain said diode normally non-conductive even in the presence of said gate pulses, means coupling the output of said source of time modulated pulses to said other electrode to couple said time modulated pulses to said other electrode to render said diode conductive during the occurrence of said modulated pulses in the duration of said gate pulses to vary the occurrence of the trailing edge of said gate pulses in accordance with the time position of said modulated pulses, and output means coupled to said one electrode to remove the resulting width modulated pulses therefrom.

3. A pulse time modulation to pulse width modulation converter comprising a source of time modulated pulses, a source of gate pulses having a duration greater than the modulation of said time modulated pulses and synchronized with respect to the repetition frequency thereof, a diode, means coupling the output of said source of gate pulses to one electrode of said diode to apply said gate pulses to said one electrode, a voltage source, a voltage divider coupled to said voltage source to provide a bias voltage, means coupling the other electrode of said diode to said voltage divider to maintain said diode normally non-conductive even in the presence of said gate pulses, means coupling the output of said source of time modulated pulses to said other electrode to couple said time modulated pulses to said other electrode to render said diode conductive during the occurrence of said modulated pulses in the duration of said gate pulses to vary the occurrence of the trailing edge of said gate pulses in accordance with the time position of said modulated pulses, and output means coupled to said one electrode to remove the resulting width modulated pulses therefrom.

4. A pulse time modulation to pulse width modulation converter comprising a source of time modulated pulses, a source of gate pulses having a duration greater than the modulation of said time modulated pulses and synchronized with respect to the repetition frequency thereof, a vacuum diode, means coupling the output of said source of gate pulses to the anode of said diode to apply said gate pulses to said anode, bias means coupled to the cathode of said diode to maintain said diode normally non-conductive even in the presence of said gate pulses, means coupling the output of said source of time modulated pulses to said cathode to couple said time modulated pulses to said cathode to render said diode conductive during the occurrence of said modulated pulses in the duration of said gate pulses to vary the occurrence of the trailing edge of said gate pulses in accordance with the time position of said modulated pulses, and output means coupled to said anode to remove the resulting width modulated pulses therefrom.

5. A pulse time modulation to pulse width modulation converter comprising a source of time modulated pulses, a source of gate pulses having a duration greater than the modulation of said time modulated pulses and synchronized with respect to the repetition frequency thereof, a semiconductor diode, means coupling the output of said source of gate pulses to the anode of said diode to apply said gate pulses to said anode, bias means coupled to the cathode of said diode to maintain said diode normally nonconductive even in the presence of said gate pulses, means coupling the output of said source of time modulated pulses to said cathode to couple said time modulated pulses to said cathode to render said diode conductive during the occurrence of said modulated pulses in the duration of said gate pulses to vary the occurrence of the trailing edge of said gate pulses in accordance with the time position of said modulated pulses, and output means coupled to said anode to remove the resulting width modulated pulses therefrom.

6. A pulse time modulation to pulse width modulation converter comprising a source of time modulated pulses, a source of gate pulses having a duration greater than the modulation of said time modulated pulses and synchronized with respect to the repetition frequency thereof, a vacuum diode, means coupling the output of said source of gate pulses to one electrode of said diode to apply said gate pulses to said one electrode, bias means coupled to the other electrode of said diode to maintain said diode normally non-conductive even in the presence of said gate pulses, means coupling the output of said source of time modulated pulses to said other electrode to couple said time modulated pulses to said other electrode to render said diode conductive during the occurrence of said modulated pulses in the duration of said gate pulses to vary the occurrence of the trailing edge of said gate pulses in accordance with the time position of said modulated pulses, and output means coupled to said one electrode to remove the resulting width modulated pulses therefrom.

7. A pulse time modulation to pulse width modulation converter comprising a source of time modulated pulses, a source of gate pulses having a duration greater than the modulation of said time modulated pulses and synchronized with respect to the repetition frequency thereof, a semiconductor diode, means coupling the output of said source of gate pulses to one electrode of said diode to apply said gate pulses to said one electrode, bias means coupled to the other electrode of said diode to maintain said diode normally non-conductive even in the presence of said gate pulses, means coupling the output of said source of time modulated pulses to said other electrode to couple said time modulated pulses to said other electrode to render said diode conductive during the occurrence of said modulated pulses in the duration of said gate pulses to vary the occurrence of the trailing edge of said gate pulses in accordance with the time position of said modulated pulses, and output means coupled to said one electrode to remove the resulting width modulated pulses therefrom.

8. A converter according to claim 7, wherein said semiconductor diode includes a germanium diode.

9. A converter according to claim 7, wherein said semiconductor diode includes a silicon junction diode.

10. A pulse time modulation to pulse width modulation converter comprising a source of time modulated pulses, a source of gate pulses having a duration greater than the modulation of said time modulated pulses and synchronized with respect to the repetition frequency thereof, a vacuum diode, a time constant circuit including a resistor and condenser disposed in a parallel relation coupling the output of said source of gate pulses to the anode of said diode to apply said gate pulses to said anode, bias means coupled to the cathode of said diode to maintain said diode normally non-conductive even in the presence of said gate pulses, means coupling the output of said source of time modulated pulses to said cathode to couple said time modulated pulses to said cathode to render said diode conductive during the occurrence of said modulated pulses in the duration of said gate pulses to vary the occurrence of the trailing edge of said gate pulses in accordance with the time position of said modulated pulses, and output means coupled to said anode to remove the resulting width modulated pulses therefrom.

11. A pulse time modulation to pulse width modulation converter comprising a source of time modulated pulses, a source of gate pulses having a duration greater than the modulation of said time modulated pulses and synchronized with respect to the repetition frequency thereof, a semiconductor diode, a time constant circuit including a resistor and condenser disposed in a parallel relation coupling the output of said source of gate pulses to the anode of said diode to apply said gate pulses to said anode, bias means coupled to the cathode of said diode to manitain said diode normally non-conductive even in the presence of said gate pulses, means coupling the output of said source of time modulated pulses to said cathode to couple said time modulated pulses to said cathode to render said diode conductive during the occurrence of said modulated pulses in the duration of said gate pulses to vary the occurrence of the trailing edge of said gate pulses in accordance with the time position of said modulated pulses, and output means coupled to said anode to remove the resulting width modulated pulses therefrom.

References Cited in the file of this patent

UNITED STATES PATENTS

| | | |
|---|---|---|
| 2,434,894 | Ambrose | Jan. 27, 1948 |
| 2,490,026 | Buckbee | Dec. 6, 1949 |
| 2,760,160 | Flood et al. | Aug. 21, 1956 |
| 2,906,825 | Thorsen | Sept. 29, 1959 |

FOREIGN PATENTS

| | | |
|---|---|---|
| 614,805 | Great Britain | Dec. 23, 1948 |
| 765,238 | Great Britain | Jan. 9, 1957 |
| 152,168 | Sweden | Nov. 1, 1955 |